(12) United States Patent
Bhatia et al.

(10) Patent No.: US 11,610,641 B2
(45) Date of Patent: Mar. 21, 2023

(54) WAFER-YIELDS AND WRITE-QOS IN FLASH-BASED SOLID STATE DRIVES

(71) Applicant: SK hynix Inc., Gyeonggi-do (KR)

(72) Inventors: Aman Bhatia, Los Gatos, CA (US); Fan Zhang, Fremont, CA (US)

(73) Assignee: SK hynix Inc., Gyeonggi-do (KR)

( * ) Notice: Subject to any disclaimer, the term of this patent is extended or adjusted under 35 U.S.C. 154(b) by 141 days.

(21) Appl. No.: 16/925,158

(22) Filed: Jul. 9, 2020

(65) Prior Publication Data

US 2022/0013191 A1  Jan. 13, 2022

(51) Int. Cl.
| | |
|---|---|
| G11C 29/44 | (2006.01) |
| G11C 16/10 | (2006.01) |
| G11C 11/56 | (2006.01) |
| G11C 16/04 | (2006.01) |
| G11C 29/04 | (2006.01) |
| G06F 12/02 | (2006.01) |
| G06F 3/06 | (2006.01) |
| G11C 29/00 | (2006.01) |

(52) U.S. Cl.
CPC .......... *G11C 29/44* (2013.01); *G11C 11/5671* (2013.01); *G11C 16/0483* (2013.01); *G11C 16/10* (2013.01); *G06F 3/064* (2013.01); *G06F 12/0246* (2013.01); *G06F 2212/214* (2013.01); *G11C 29/04* (2013.01); *G11C 29/765* (2013.01); *G11C 2211/5641* (2013.01)

(58) Field of Classification Search
CPC ................ G06F 12/0246; G06F 3/064; G06F 2212/214; G11C 16/0483; G11C 2211/5641; G11C 29/765; G11C 29/04; G11C 29/44; G11C 11/5671; G11C 16/10
See application file for complete search history.

(56) References Cited

U.S. PATENT DOCUMENTS

| | | | |
|---|---|---|---|
| 7,295,479 B2 | 11/2007 | Yoon et al. | |
| 8,560,922 B2 | 10/2013 | Bivens et al. | |
| (Continued) | | | |

OTHER PUBLICATIONS

Wang, et al., "Extending the Lifetime of NAND Flash Memory by Salvaging Bad Blocks", 2012 Design, Automation & Test in Europe Conference & Exhibition (DATE), Mar. 12-16, 2012, 4 pages.

*Primary Examiner* — Cynthia Britt
*Assistant Examiner* — Sazzad Hossain
(74) *Attorney, Agent, or Firm* — Weaver Austin Villeneuve & Sampson LLP

(57) ABSTRACT

A non-volatile data storage device includes memory cells arranged in a plurality of blocks and a memory controller coupled to the memory cells for controlling operations of the memory cells. The memory controller is configured to determine if a given block is a bad m-bit multi-level block. In an m-bit multi-level block, each memory cell is an m-bit multi-level cell (MLC), m being an integer equal to or greater than 2. Upon determining that the given block is a good m-bit multi-level block, the memory controller assigns the given block to be an m-bit multi-level user block. Upon determining that the given block is a bad m-bit multi-level block, the memory controller determines if the given block is a good n-bit block. In an n-bit block, each memory cell is an n-bit cell, n being an integer less than m. Upon determining that the given block is a good n-bit block, the memory controller assigns the given block to be an n-bit user block or an n-bit write-buffer block.

20 Claims, 12 Drawing Sheets

(56) References Cited

U.S. PATENT DOCUMENTS

| | | | |
|---|---|---|---|
| 8,886,990 B2 | 11/2014 | Meir et al. | |
| 9,123,422 B2 | 9/2015 | Yu et al. | |
| 10,650,886 B2 | 5/2020 | Natarajan et al. | |
| 2011/0271043 A1* | 11/2011 | Segal | G06F 12/0246 |
| | | | 711/103 |
| 2016/0180936 A1* | 6/2016 | Choi | G11C 29/70 |
| | | | 365/185.12 |
| 2018/0211708 A1* | 7/2018 | Igahara | G11C 16/105 |
| 2019/0043604 A1* | 2/2019 | Baca | G11C 29/883 |
| 2020/0034223 A1 | 1/2020 | Rori et al. | |
| 2020/0286562 A1* | 9/2020 | Gorobets | G06F 11/1068 |

\* cited by examiner

Figure 2: Fraction of TLC blocks that are unavailable for storing user data at different times during the lifetime of the drive. The drive can work as long as fraction of blocks not available remains below 3%.

*Figure 6: Fraction of TLC blocks that are unavailable for storing user data at different times during the lifetime of the drive (proposed scheme in green). The drive can work as long as fraction of blocks not available remains below 3% (3.5% for proposed scheme when some bad-blocks are used as SLC for storing user data).*

US 11,610,641 B2

WAFER-YIELDS AND WRITE-QOS IN FLASH-BASED SOLID STATE DRIVES

BACKGROUND OF THE INVENTION

The present invention relates generally to systems and methods for storage devices, and specifically to improving performance of non-volatile memory devices.

NAND-Flash based solid state drives (SSDs) have better random-read performance compared with magnetic-based hard disk drives (HDDs). However, these drives have low write performance, and the cost per gigabytes (GB) is still approximately 10× higher compared with high capacity HDDs. Improvements in these metrics can increase the total addressable market of SSDs by allowing them to be used in write-heavy and cost-sensitive applications that currently depend on HDDs.

Previous Flash memories are single-level cell (SLC) flash memories, which stores one bit per memory cell. A current approach to reducing cost is to pack more bits per Flash cell, for example, multi-level cell (MLC) Flash memories, to increase the density over SLC Flash memory. However, this approach can reduce the noise-margin in cell-level distributions for triple-lever cell (TLC) and quad-level cell (QLC) Flash memories. Due to the smaller noise margin, these memories have lower yield as well as require longer programming time (t-prog). The lower yield can reduce the benefits of the cost reduction, and the longer t-prog can lead to higher write latencies. To maintain low latencies for host-writes, these SSDs often employ expensive super-capacitor backed dynamic random access memories (DRAMs) as write-buffers for cost-insensitive applications like enterprise SSDs or suffer from the high write-latencies.

BRIEF SUMMARY OF THE INVENTION

In the conventional method of bad-block management, a single bad page in a block can cause the whole block to be removed from usage. The inventors have recognized that this practice can reduce overprovision (OP), which refers to the difference between the physical capacity of the flash memory and the logical capacity presented as available for the user, and lead to more write amplification (WA), which refers to the actual amount of information physically-written to the storage media as a multiple of the logical amount intended to be written. Reducing overprovision and increasing write amplification can degrade the reliability of the memory device, as explained further below. Some embodiments of the invention provide an intermediate state between a physical block changing from a good block to a bad block, when the number of bad word lines inside a block is less than a certain threshold. This technique can delay the block retirement, increase overprovisioning, and reduce unnecessary background operations. Some embodiments also includes techniques to cluster the block types and program the degraded block.

For example, flash memory blocks that are not able to meet tight noise margins of TLC/QLC can be identified as bad blocks and are used as write-buffers in SLC mode which allows a wider margin. Assigning bad block to SLC write-buffer may happen during initial screening to improve wafer-yield. In addition, when TLC/QLC blocks degrade during the lifetime of the drive such that they may no longer meet the margin requirement, the SSD firmware can mark these bad blocks and use these bad blocks as additional SLC write-buffers instead of increasing the number of bad blocks. Increase in the write-buffer size can improve the write quality-of-service (QoS), by requiring lower rate of flushing host-writes from buffer to Flash). It may also be used to improve the accuracy of programming for other blocks, by allowing additional programming steps for finer control, thereby reducing bit-error rates of read operations.

Some embodiments of the present invention provide a non-volatile data storage device that includes memory cells arranged in blocks and a memory controller coupled to the memory cells for controlling operations of the memory cells. An example of a data storage device is described above in connection with FIG. 1. Further details of the memory device and memory controller are described below in connection with FIG. 11. In some embodiments, the memory controller is configured to determine if a given block is a bad m-bit multi-level block, wherein each memory cell is an m-bit multi-level cell (MLC), m being an integer equal to or greater than 2.

In some embodiments, a method is provided for controlling a storage system. The storage system can include memory cells arranged in a plurality of blocks and a memory controller coupled to the memory cells for controlling operations of the memory cells. The method includes determining if a given block is a bad m-bit multi-level block, wherein each memory cell is an m-bit multi-level cell (MLC), m being an integer equal to or greater than 2. Upon determining that the given block is a good m-bit multi-level block, the method assigns the given block to be an m-bit multi-level user block. Upon determining that the given block is a bad m-bit multi-level block, the method includes determining if the given block is a good n-bit block, wherein each memory cell is an n-bit cell, n being an integer less than m. Upon determining that the given block is a good n-bit block, the method assigns the given block to be an n-bit user block or an n-bit write-buffer block.

A further understanding of the nature and advantages of the present invention may be realized by reference to the remaining portions of the specification and the drawings.

DETAILED DESCRIPTION OF THE INVENTION

Figure 1:
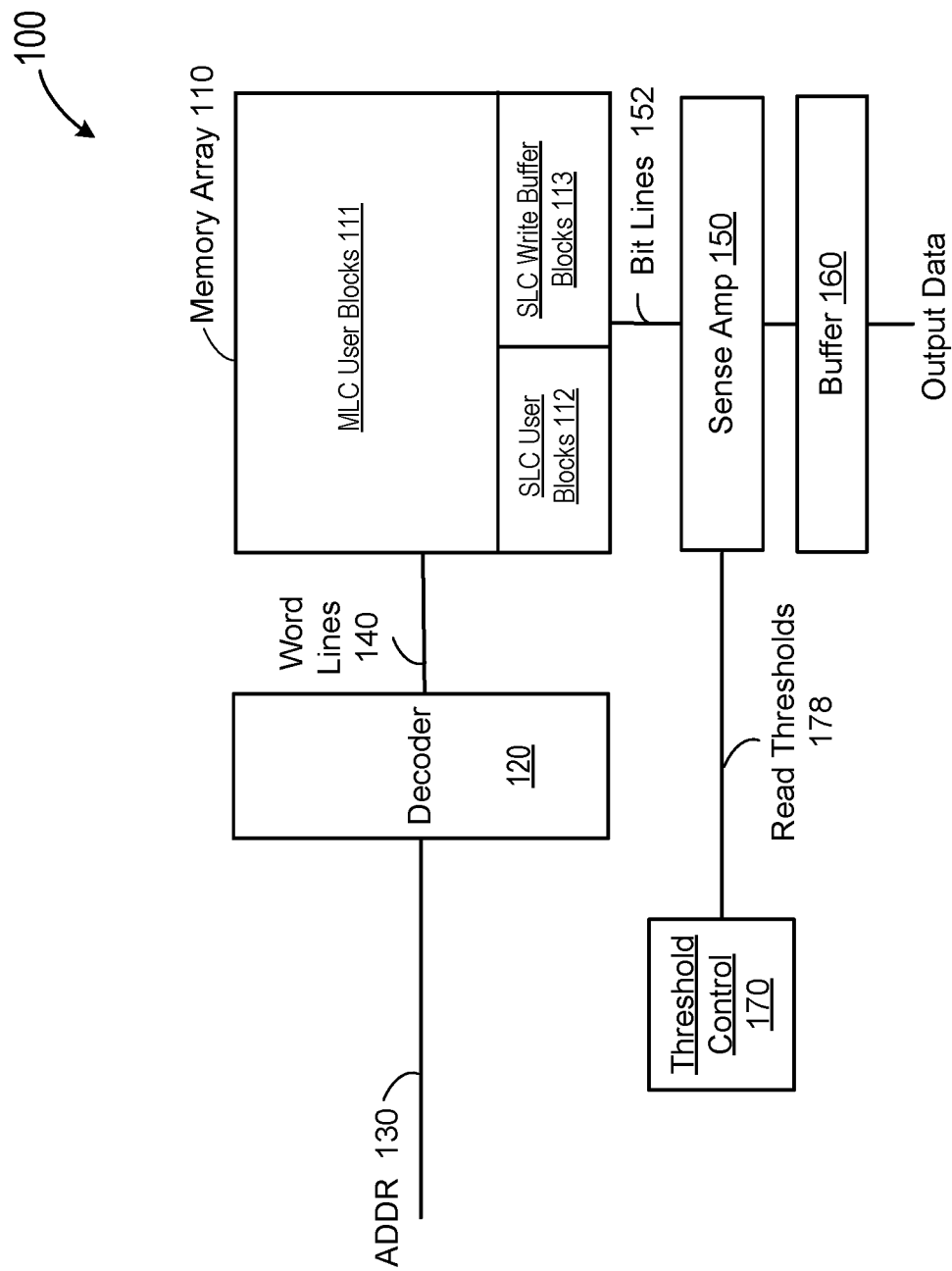
FIG. 1 is a simplified block diagram of a memory device according to some embodiments of the present invention.

FIG. 1 is a simplified block diagram of a memory device according to some embodiments of the present invention. In this example, a flash memory device 100 includes a memory cell array 110 having a plurality of non-volatile memory cells. In some embodiments, the memory cells are arranged in a plurality of memory blocks. Each memory block can include multiple non-volatile memory cells, each memory block being associated with a corresponding address. Memory device 100 also includes a decoder 120, for example a row decoder. As an example, decoder 120 receives a command for a memory operation with an address ADDR 130, e.g., a read command with a read address. The address 130 can be a logic address. In an embodiment, the memory operations, such as read, write or program, and erase, etc., are directed to a group of memory cells, for example, a page, a sector, or a block. As described above, a block can include multiple pages. A read or program command is often directed to a page, and an erase command can be directed to a block. Depending on the embodiment, a page or a sector can be 0.5 Kbytes to 4 Kbytes, or a different size. Depending on the embodiments, a page or a sector can include memory cells coupled to the same word line. In this case, decoder 120 selects word lines (WL) 140 based on information on ADDR 130 for selecting a memory page, which can be a row of memory cells coupled to the selected word line. Therefore, pages and word lines are used interchangeably.

A sense amplifier block 150 is coupled to memory cell array 110 through bit lines 152. A buffer block 160 is coupled to sense amplifier block 150 and provides output data to an external device. In a read operation, sense amplifier block 150 senses the data stored in each memory cell of the memory cell array 110 and provides the data to buffer block 160. In a write or program operation, buffer block 160 presents the data to be written or programmed to the memory array 110.

During a memory read operation, the charges in a nonvolatile memory cell selected by a word line are read out. Depending on the charges stored in a memory cell, its cell threshold voltage can vary. A read voltage higher than cell threshold voltage can be used to determine the data stored in the memory cell. In some embodiments, each of the non-volatile memory cells can be a multilevel memory cell, and multiple threshold voltages are used to determine the data state of the memory cell, as represented by a bit pattern. In these cases, a threshold control circuit 170, which provides read thresholds 178, can be used to control the threshold voltages.

Flash-memory based solid state disk (SSD) drive can contain many flash memory dies. Each flash die can contain thousands of physical blocks. Each block can contain hundreds or thousands of flash pages. In some cases, a flash block is the atomic unit (i.e., the smallest addressable unit) for erase operation, and a flash page can be the atomic unit for read or program operation. In other words, in these cases, an erase operation is carried out one block at a time, and a read or program operation is carried out one page at a time.

In some embodiments, the data storage device can include multi-level user blocks 111, in which each memory cell is an m-bit multi-level cell (MLC), m being an integer. The data storage device can also include single-level user blocks 112 for storing user data, wherein each memory cell is a one-bit single level cell (SLC), and single-level write-buffer blocks 113 for improving write operation latency, wherein each memory cell is a one-bit single level cell (SLC).

Figure 2:
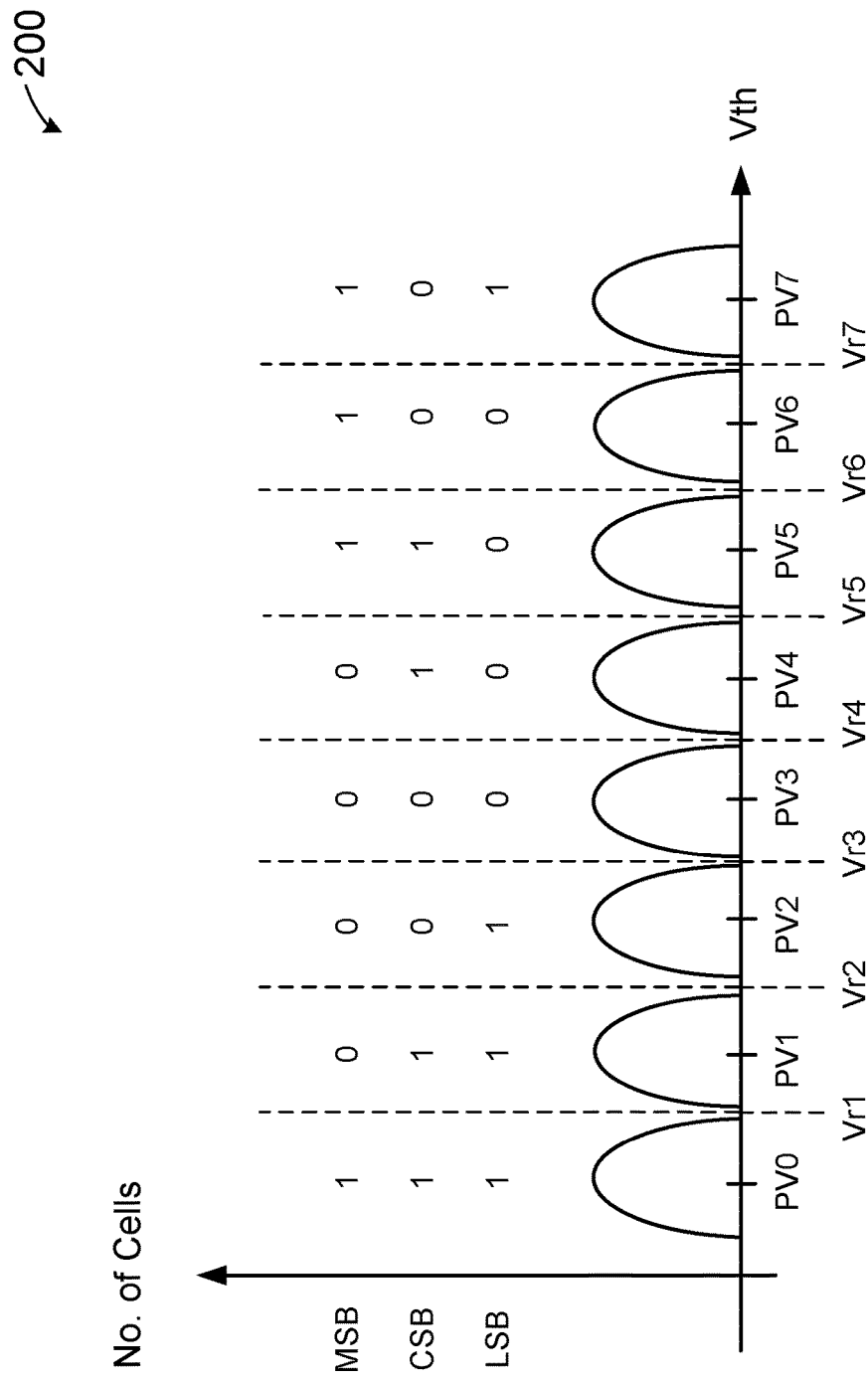
FIG. 2 is a simplified diagram illustrating a distribution of cell voltages of a memory device having a 3-bit tri-level cell (TLC) in a flash memory device according to some embodiments of the present invention.

FIG. 2 is a simplified diagram 200 illustrating a distribution of cell voltages of a memory device having a 3-bit tri-level cell (TLC) in a flash memory device according to some embodiments of the present invention. In FIG. 2, the target cell programmed voltage (PV) for an erase state is shown as "PV0," and the programmed voltages (PV) for seven programmed states are shown as "PV1" to "PV7." The distribution of cell voltages, or cell threshold voltages, for each of eight data states is represented as a bell-shaped curve associated with each programmed voltage (PV). The spread in cell threshold voltage can be caused by differences in cell characteristics and operation history. In FIG. 2, each cell is configured to store eight data states represented by three bits: a most significant bit (MSB), a center significant bit (CSB), and a least significant bit (LSB). Also shown in FIG. 2 are seven read thresholds, labeled as "Vr1," "Vr2," . . . , and "Vr7," which are used as reference voltages to determine the data stored in the memory cell. For example, two thresholds, Vr1 and Vr5, are used to read the MSB. If the voltage stored by the cell (the programmed voltage or PV) is less than Vr1 or is greater than Vr5, then the MSB is read as a 1. If the voltage is between Vr1 and Vr5, then the MSB is read as a 0. Two thresholds, Vr3 and Vr7, are used to read the LSB. If the voltage stored by the cell is less than Vr3 or is greater than Vr7, then the LSB is read as a 1. If the voltage is between Vr3 and Vr7, then the LSB is read as a 0. Similarly, three thresholds, Vr2, Vr4, and Vr6, are used to read the CSB.

Figure 3:
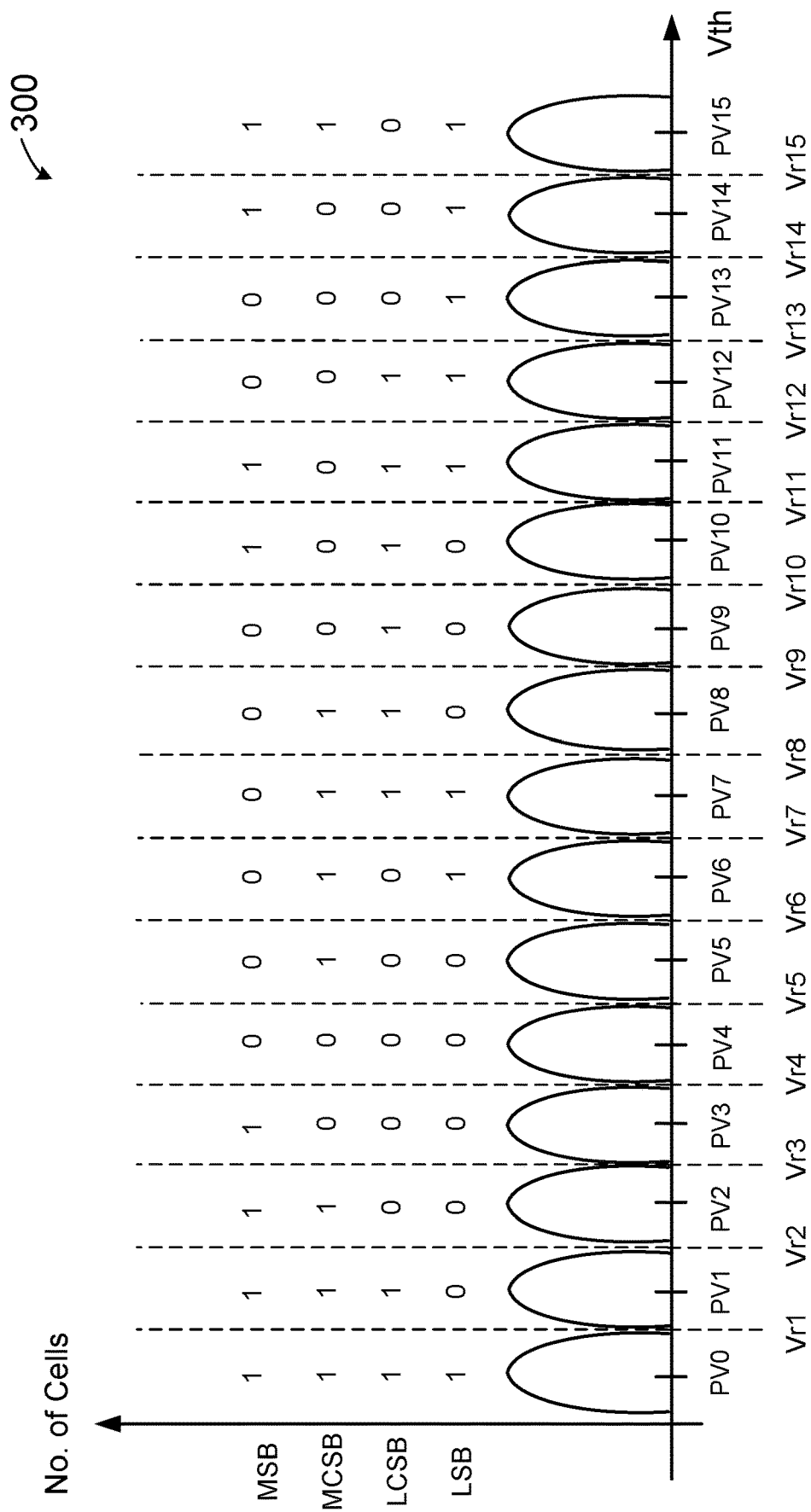
FIG. 3 is a simplified diagram illustrating a distribution of cell voltages of a memory device having a 4-bit quad-level cell (QLC) in a flash memory device according to some embodiments of the present invention.

FIG. 3 is a simplified diagram 300 illustrating a distribution of cell voltages of a memory device having a 4-bit quad-level cell (QLC) in a flash memory device according to some embodiments of the present invention. In quad-level cells (QLC) Flash, there are 16 PV-levels and each level corresponds to a unique 4-bit tuple. In FIG. 3, the target cell programmed voltage (PV) for an erase state is shown as "PV0," and the programmed voltages (PV) for 15 programmed states are shown as "PV1" to "PV15." The first, second, third, and fourth bits of the cells are grouped together into LSB (least significant bit), LCSB (least central significant bit), MCSB (most central significant bit), and MSB (most significant bit) pages, respectively. Also shown in FIG. 3 are 15 read thresholds, labeled as "Vr1," "Vr2," . . . , and "Vr15," which are used as reference voltages to determine the data stored in the memory cell. Similar to the description above in connection with TLC, in QLC, multiple reads using various combinations of read threshold voltages are carried out to determine the 16 PV levels in each cell to determine the four bits stored in the cell.

Like previous 2D flash memory, the different PV-levels on neighbor flash cells in a 3D flash memory can have different noise-variances on the neighboring victim flash cells, which might cause the threshold voltage of the victim cell, or target cell, to increase or decrease. The amount of threshold voltage increase can depend on several factors, for example, 1) the exact neighbor values being programmed; and 2) how the neighbor values are programmed, etc. This can cause challenges in designing flash controller to support changing flash memory, especially new generations flash memory such as QLC drives.

Some QLC drives are built with stacked charge-trapping based 3-D NAND cells. In these cells, influence of an upper neighboring cell and lower neighboring cells can be caused by charge leakage into or from the target or victim cell. These neighboring cells can cause increase or decrease of the threshold voltage of the target cell as the retention time increases. In this case, the upper neighboring cell and the lower neighboring cell can share a bit line with the target cell. In addition, neighboring cells along a shared word line can also influence the threshold voltage of the target get, as a result of, e.g., programming operations.

Figure 4A:
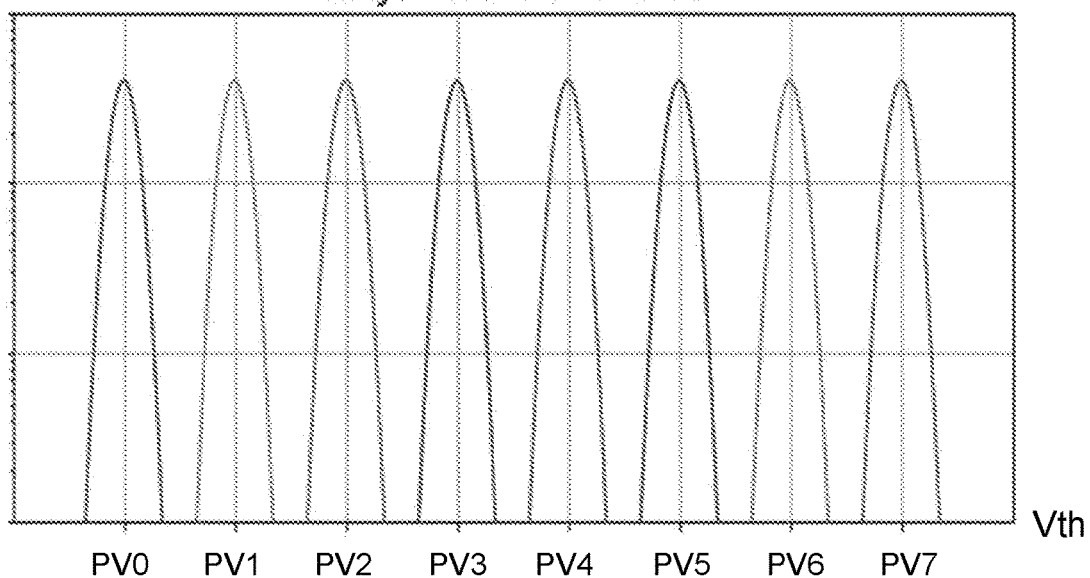
FIGS. 4A and 4B illustrate examples of cell levels for low and high program-erase cycles, respectively, according to some embodiments of the present invention.
Figure 4B:
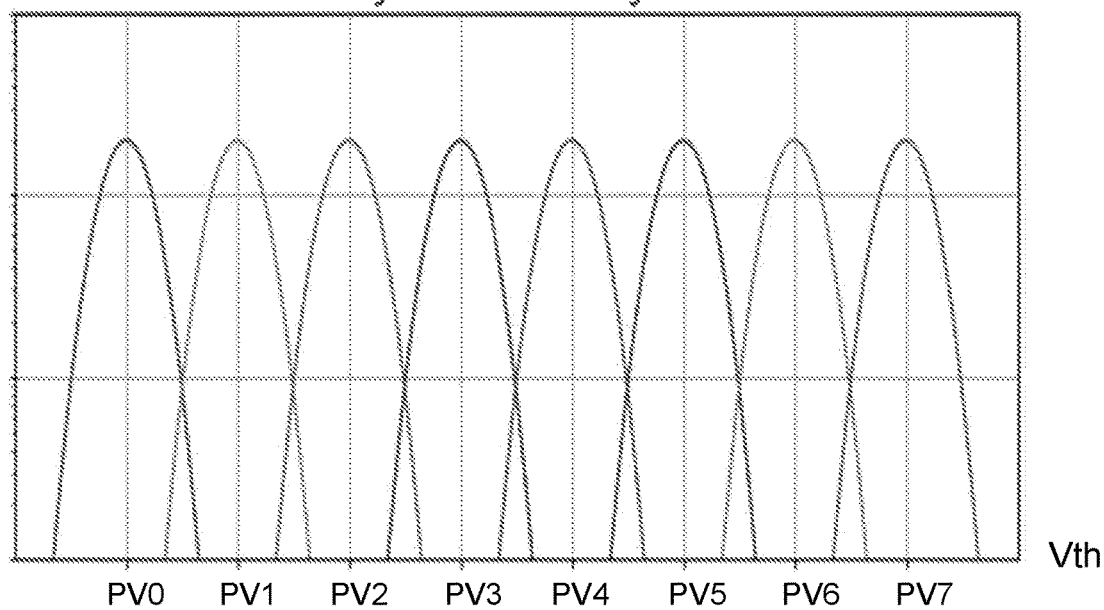

FIGS. 4A and 4B illustrate examples of cell levels for different program-erase cycles according to some embodiments of the present invention. Flash cells store bits by modulating the electrons stored in a charge-trapping layer or a floating-gate layer. As the memory device experiences program-erase cycles (PECs), the charge-trapping layer in the cells degrades, and the cells' ability to store electrons is degraded. This can result in higher variance of cell-levels in all PV-levels, which increases the bit error rates of read operations from such pages. For example, FIG. 4A illustrates an examples of cell levels for low program-erase cycles (PECs), and FIG. 4B illustrates an examples of cell levels for high program-erase cycles (PECs). In both FIGS. 4A and 4B, the target cell programmed voltage (PV) are shown for TLC cells, from "PV0" to "PV7." The distribution of cell voltages, or cell threshold voltages, for each of the eight data states is represented as a bell-shaped curve associated with each programmed voltage (PV). The spread in cell threshold voltage can be caused by differences in cell characteristics and operation history. FIG. 4A illustrates the distribution of cell threshold voltages after a low number of program erase cycles (PECs), and FIG. 4B illustrates the distribution of cell threshold voltages after a high number of program erase cycles (PECs). It can be seen that the spread or variance in cell threshold voltages in FIG. 4B is wider than the spread in cell threshold voltages in FIG. 4A.

One method of reducing error-rates is to use a larger number of program-verify pulses with each pulse of a shorter duration. However, increasing the number of program-verify pulses can increase the programming time (t-prog), which causes write performance and QoS degradation.

Figure 5:
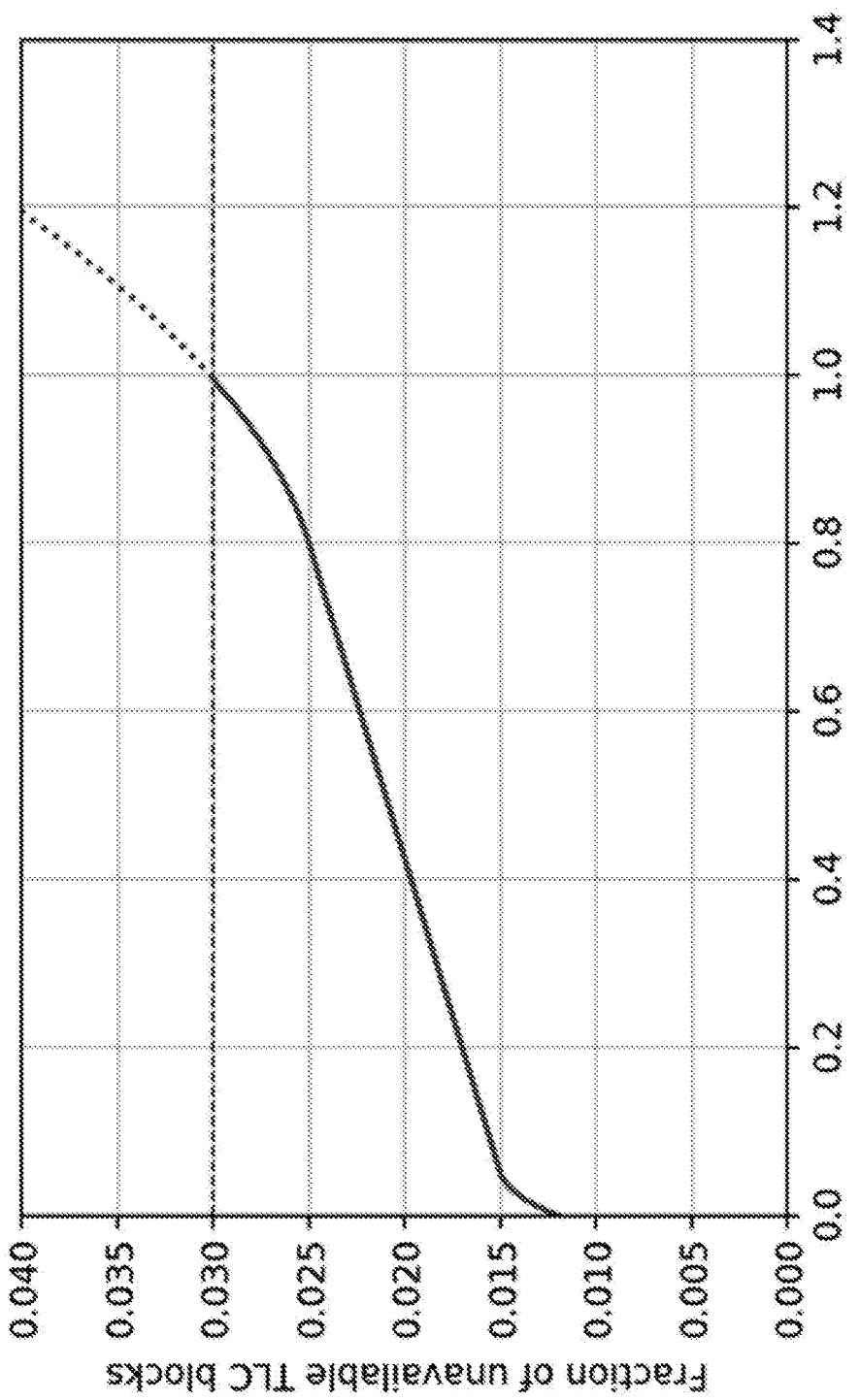
FIG. 5 is a diagram illustrating the fraction of unavailable TLC blocks as a function of the lifetime of the memory according to some embodiments of the present invention.

FIG. 5 is a diagram illustrating the fraction of unavailable TLC blocks as a function of the lifetime of the memory according to some embodiments of the present invention. A block with many damaged cells is unable to provide data-integrity at higher retentions due to the reduced noise margins and weakened charge-retention capabilities. Such "bad blocks" may appear due to manufacturing defects or due to program-erase cycling during the lifetime of the SSD as shown in FIG. 5. As shown in FIG. 5, the fraction of TLC blocks that are unavailable for storing user data increases during the lifetime of the drive. In this example, the drive can work as long as the fraction of blocks not available remains below 3%. In FIG. 5, the fraction of blocks unavailable reaches 3% at the normalized lifetime of 1.0.

During the lifetime of SSD, the reliability quality of flash blocks may be degraded overtime, and some blocks may be identified as bad blocks and removed from the available flash block list. Removing bad blocks can reduce the actual overprovisioning (OP) of the whole SSD and thus cause larger write amplification. In a data storage device such as a solid state drive (SSD), overprovisioning (OP) refers to the inclusion of extra storage capacity. SSD overprovisioning can increase the endurance of a solid state drive by distributing the total number of writes and erases across a larger population of NAND flash blocks and pages over time. It can also improve performance by giving the flash controller additional buffer space for managing program/erase (P/E) cycles and improving the probability that a write operation will have immediate access to a pre-erased block. The extra capacity is not visible to the host as available storage.

Because flash memory must be erased before it can be rewritten, with much coarser granularity of the erase operation when compared to the write operation, the process to perform these operations results in moving (or rewriting) user data and metadata more than once. Thus, rewriting some data requires an already used portion of flash to be read, updated, and written to a new location, together with initially erasing the new location if it was previously used at some point in time; due to the way flash works, much larger portions of flash must be erased and rewritten than actually required by the amount of new data. This multiplying effect, known as write amplification (WA), can increase the number of writes required over the life of the SSD, which shortens the time it can reliably operate. The increased writes also consume bandwidth to the flash memory which mainly reduces random write performance to the SSD. Write amplification can be measured by the ratio of writes committed to the flash memory to the writes coming from the host system.

Flash manufacturers often allow some bad blocks in the NAND devices during the initial screening process by building some redundant blocks that are used as replacement. This allows higher wafer-yields but dies with initial bad blocks greater than the number of replacement blocks that are rejected during the screening.

Figure 6:
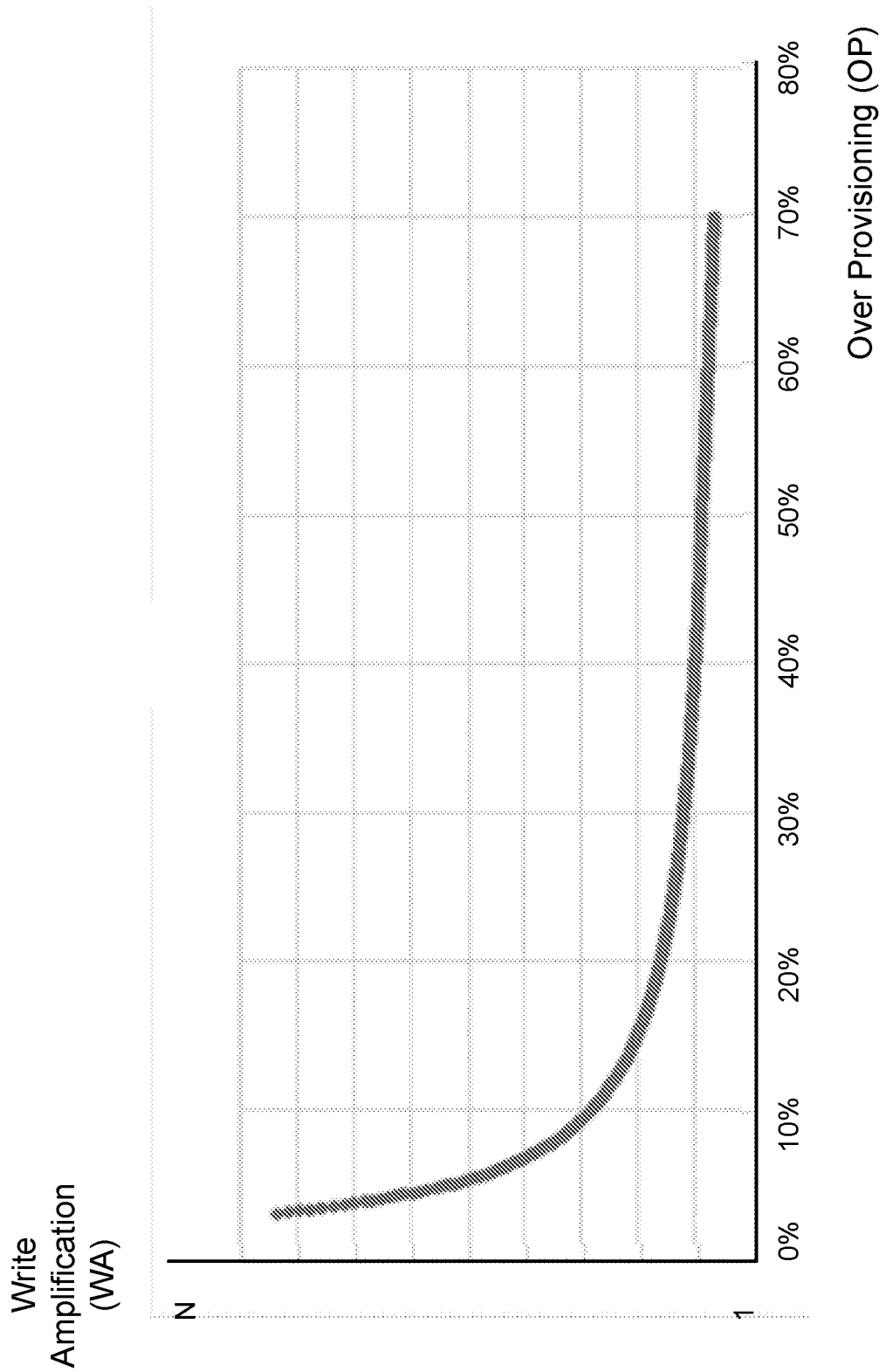
FIG. 6 is a simplified diagram illustrating correlation between write amplification (WA) and overprovisioning (OP) in a memory device according to some embodiments of the present invention.

Moreover, when the number of bad blocks increases during the lifetime of the device, the overprovisioning (OP) of the drive goes down which in turn increases the write-amplification (WA) dramatically, as shown in FIG. 6.

FIG. 6 is a simplified diagram illustrating correlation between write amplification and overprovisioning in a memory device according to some embodiments of the present invention. The x-axis is overprovisioning (OP) and the y-axis is the write amplification (WA). In FIG. 6, the horizontal axis is the overprovisioning in percentage. The vertical axis is write amplification, which is often expressed in write amplification factor (WAF) and can be a number between 1 and N. It can be seen from FIG. 6 that as overprovisioning increases, write amplification decreases. In general, the more bad blocks, the smaller the (OP) overprovisioning, which tends to lead to more write amplification (WA). The increasing write amplification can cause the flash blocks to be worn out faster and can cause the whole drive to come to the end of life quickly. In some conventional systems, whenever a bad word line or page is found anywhere in a block, the block is marked as bad block and removed from usage. This practice can exacerbate the problem of reducing over provisioning and increasing write amplification.

Due to the reasons explained above, the rate of program-erase cycling accelerates towards the end-of life (EOL) of the drive as more blocks reach their endurance limits and are marked as bad by the SSD firmware. The reduced OP also increases the frequency of garbage collection operations which further degrades write-QoS.

Figure 7:
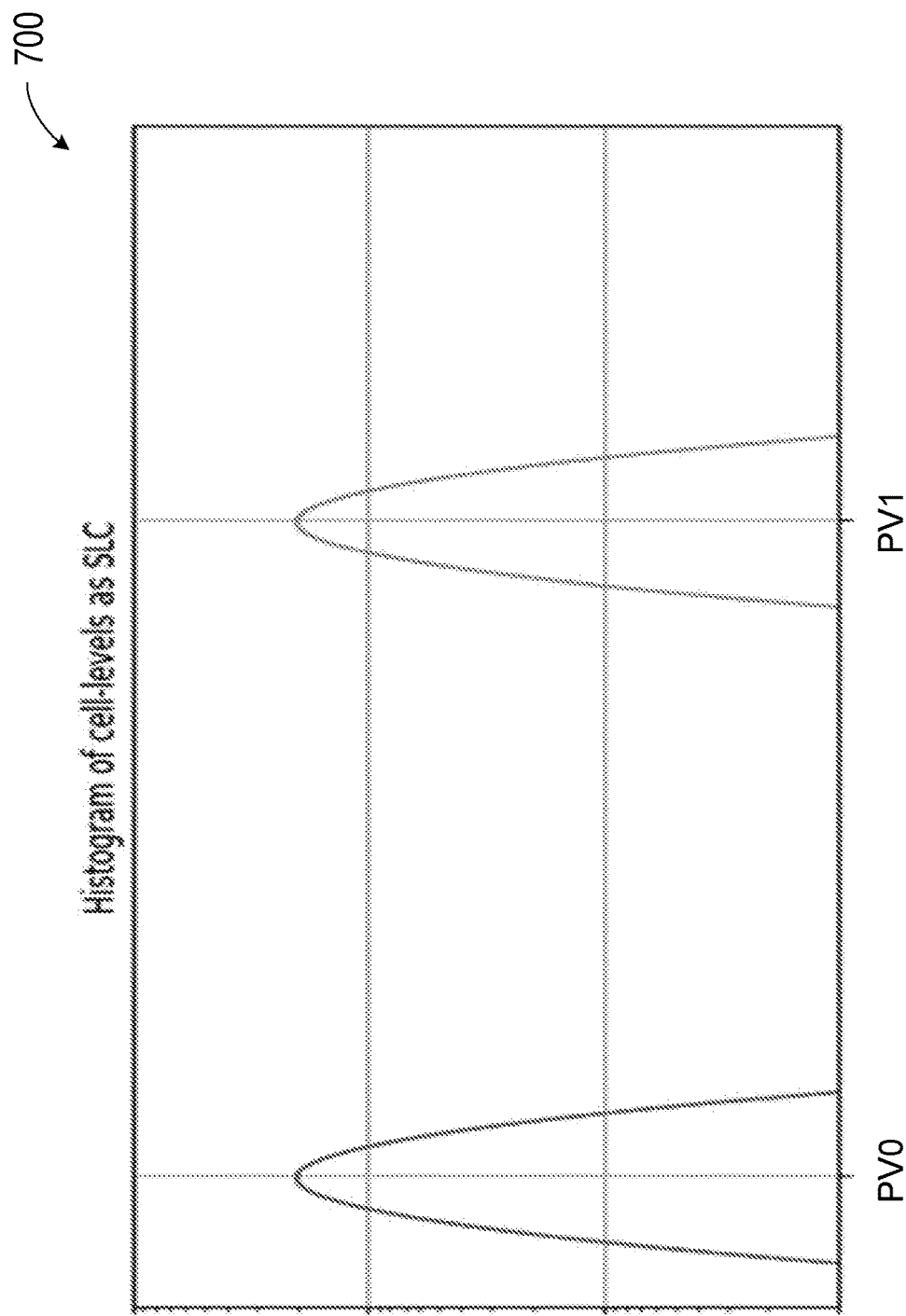
FIG. 7 is a simplified diagram 700 illustrating a distribution of cell voltages of a memory device having a single-bit single-level cell (SLC) in a flash memory device according to some embodiments of the present invention.

In embodiments of the present invention, bad blocks with insufficient noise-margins for TLC/QLC operations can still be candidates to be used as single-level cells (SLCs). FIG. 7 is a simplified diagram 700 illustrating a distribution of cell voltages of a memory device having a single-bit single-level cell (SLC) in a flash memory device according to some embodiments of the present invention. In FIG. 7, the target cell programmed voltage (PV) for an erase state is shown as "PV0," and the programmed voltage (PV) for the programmed state is shown as "PV1." Flash blocks designed for storing multiple bits per cell can also be used for storing a single bit (as SLC Flash) by dividing the range of cell-levels into two PV-levels instead of eight for TLC (or sixteen for QLC) as shown in FIG. 7. This increases the noise margin between adjacent PV-levels and achieves much lower bit-error rates even when the variance in cell-levels is high.

In some embodiments, the bad blocks are used as SLC write-caches or write buffers since the write cache requires much smaller retention periods (less than a minute) compared to other blocks (many weeks). These SLC write-cache blocks may be used to supplement the write-cache pages in DRAM. Under such a scheme, the number of write-cache buffers varies dynamically during the lifetime of the device. As the number of bad blocks increases, OP decreases but the number of write-cache buffers increases. The increased number of write-buffers allows the use of a larger number of program-verify pulses without degrading the write-QoS due to the increased t-prog. This increases the noise margin in other blocks and reduces the chances of encountering another bad block.

In some other embodiments, the bad block can be utilized for storing user data but as a SLC block, if it can still support the required reliability at higher retention periods and the number of write-cache buffers has reached a fixed threshold Nmax. Under this method the drop in OP is reduced by 33%, since the capacity of an SLC block is ⅓ of the capacity of a TLC block. Further, the impact of bad blocks on write-amplification and write-QoS is reduced.

Some embodiments of the present invention provide a non-volatile data storage device that includes memory cells arranged in blocks and a memory controller coupled to the memory cells for controlling operations of the memory cells. An example of a data storage device is described above in connection with FIG. 1. Further details of the memory device and memory controller are described below in connection with FIG. 11. In some embodiments, the memory controller is configured to determine if a given block is a bad m-bit multi-level block, wherein each memory cell is an m-bit multi-level cell (MLC), m being an integer equal to or greater than 2.

Upon determining that the given block is a good m-bit multi-level block, the memory controller assigns the given block to be an m-bit multi-level user block. Upon determining that the given block is a bad m-bit multi-level block, the memory controller determines if the given block is a good n-bit block, wherein each memory cell is an n-bit cell, n being an integer less than m. Upon determining that the given block is a good n-bit block, the memory controller assigns the given block to be an n-bit user block or an n-bit write-buffer block. As an example, m=3 and n=1, and each memory cell in an m-bit multi-level block is a 3-bit tri-level cell (MLC), and each memory cell in an n-bit multi-level block is a single-bit single-level cell (MLC). In some cases, upon determining that the given block is a good 2-bit block, the memory controller assigns the given block to be an 2-bit user block or an n-bit write-buffer block. In other cases, upon determining that the given block is a good single-bit (SLC) block, the memory controller assigns the given block to be a single-bit (SLC) user block or a single-bit (SLC) write-buffer block.

Some embodiments of the present invention provide a non-volatile data storage device that includes memory cells arranged in blocks, each block including multiple pages and each of the multiple pages having a number of memory cells. An example of the data storage device is described above in connection with FIG. 1. The data storage device includes multi-level user blocks, in which each memory cell is an m-bit multi-level cell (MLC), m being an integer. The data storage device also includes single-level user blocks for storing user data, wherein each memory cell is a one-bit single level cell (SLC), and single-level write-buffer blocks for improving write operation latency, wherein each memory cell is a one-bit single level cell (SLC). The data storage device also includes a memory controller coupled to the memory cells for controlling erase, program, and read operations of the memory cells. In some embodiments, the memory controller is configured to perform the operations illustrated in the flowchart of FIG. 8.

Figure 8:
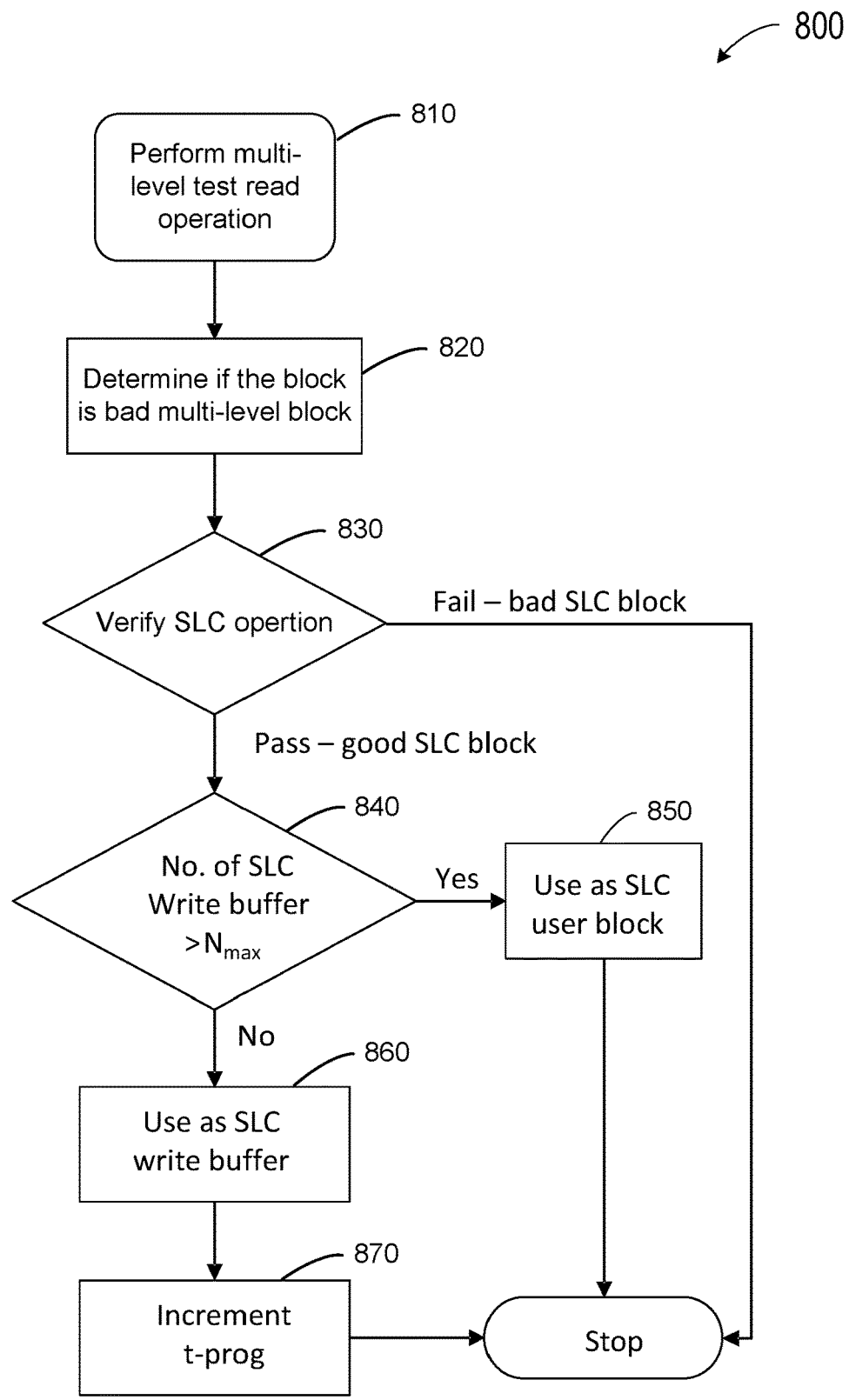
FIG. 8 is a simplified flowchart illustrating a method for operating a storage system according to some embodiments of the present invention.

FIG. 8 is a simplified flowchart illustrating a method of operating a storage system according to some embodiments of the present invention. As shown in FIG. 8, method 800 includes, at 810, performing a multi-level test read operation, for example, a TLC read operation, of a target memory cell in response to a read command from a host. At step 820, determine if a given block is a bad multi-level block. At 830, upon determining that the given block is a bad multi-level block, the method performs a single-level test read operation to determine if the given block is a good single-level block. At 840, upon determining that the given block is a good single-level block, the method determines whether the total number of single-level write-buffer blocks exceeds a threshold value. At 850, upon determining that the total number of single-level write-buffer blocks exceeds the threshold value, the method assigns the given block to be a single-level user block. At 860, upon determining that the total number of single-level write-buffer blocks does not exceed a threshold value, the method assigns the given block to be a single-level write-buffer block. At 870, optionally, the cell programming time t-prog can be incremented. The increased number of write-buffers allows the use of larger number of program-verify pulses without degrading the write-QoS due to the increased t-prog. This increases the noise margin in other blocks and reduces the chances of encountering another bad block.

Figure 9:
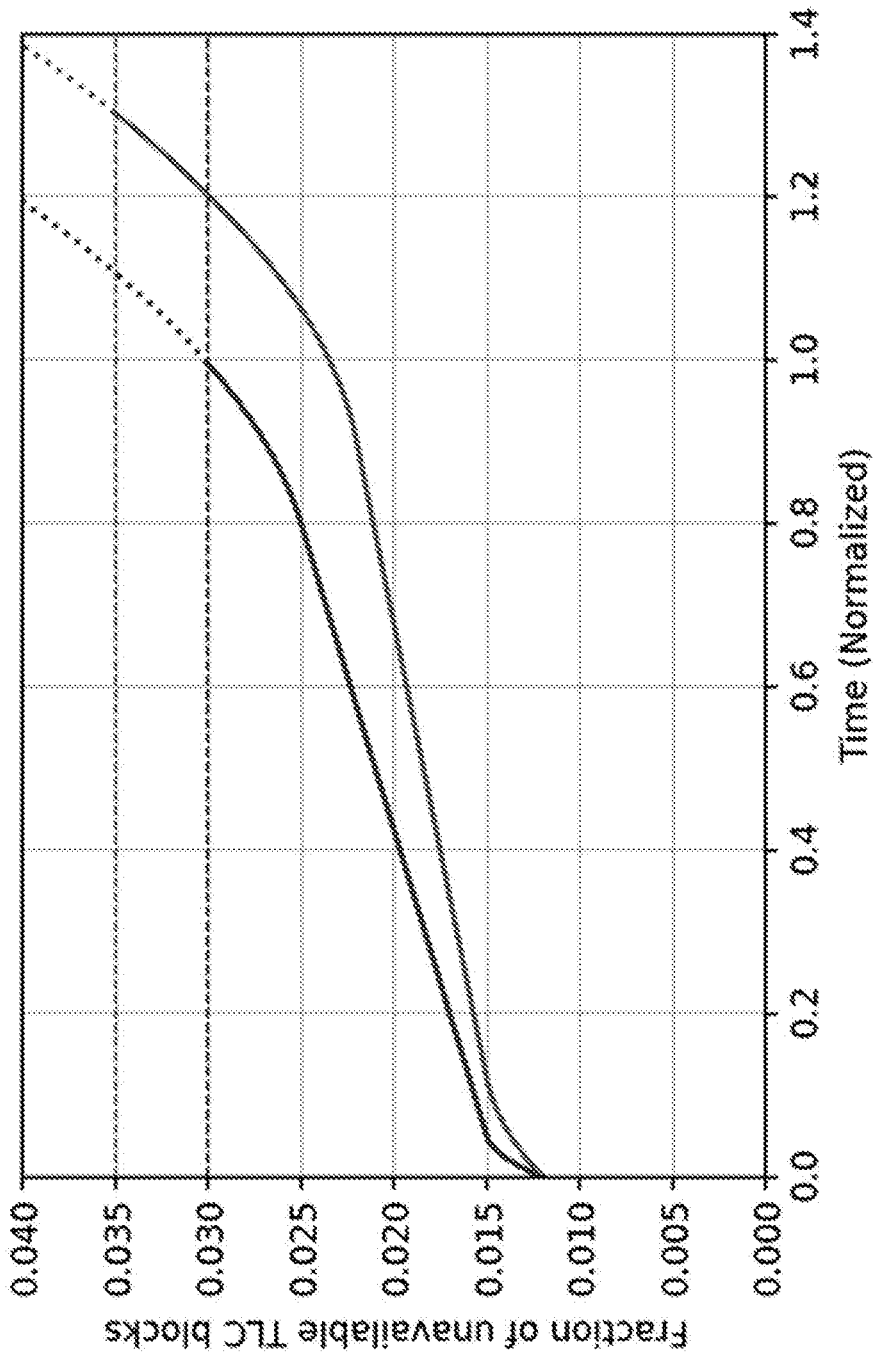
FIG. 9 illustrates the improvement of percentage of available blocks available in the pool over the lifetime of the device according to some embodiments of the present invention.

FIG. 9 illustrates the improvement of percentage of available blocks available in the pool over the lifetime of the device according to some embodiments of the present invention. In FIG. 9, the fraction of TLC blocks that are unavailable for storing user data at different times during the lifetime of the drive is plotted against a normalized time scale. Curve 901 shows the change in the fraction of TLC blocks unavailable for storing user data in a conventional flash drive. Curve 902 shows the change in the fraction of TLC blocks unavailable for storing user data according to an embodiment of the invention. In some cases, the drive can work as long as the fraction of blocks not available remains below 3% as shown by the dotted line 903. It can be seen that in the conventional device 901, the normalized useful lifetime is 1. From 902, in the device according to the embodiments of the invention in which bad TLC blocks are used as write cache buffer, the normalized lifetime is about 1.2. Moreover, the useful lifetime can be further extended, if some bad blocks are used as SLC for storing user data. In this case, the acceptable fraction of TLC blocks unavailable for storing user data can be raised to 3.5% in this example.

In some embodiments, a method is provided for controlling a storage system. The storage system can include memory cells arranged in a plurality of blocks and a memory controller coupled to the memory cells for controlling operations of the memory cells. The method includes determining if a given block is a bad m-bit multi-level block, wherein each memory cell is an m-bit multi-level cell (MLC), m being an integer equal to or greater than 2. Upon determining that the given block is a good m-bit multi-level block, the method assigns the given block to be an m-bit multi-level user block. Upon determining that the given block is a bad m-bit multi-level block, the method includes determining if the given block is a good n-bit block, wherein each memory cell is an n-bit cell, n being an integer less than m. Upon determining that the given block is a good n-bit block, the method assigns the given block to be an n-bit user block or an n-bit write-buffer block.

As an example, in an embodiment of the above method, m=3 and n=1. In this case, each memory cell in an m-bit multi-level block is a 3-bit tri-level cell (TLC), and each memory cell in an n-bit multi-level block is a single-bit single-level cell (SLC).

In another example, in an embodiment of the above method, m=3 and n=2. In this case, each memory cell in an m-bit multi-level block is a 3-bit tri-level cell (TLC), and each memory cell in an n-bit multi-level block is a two-bit multi-level cell (MLC).

In other examples, m and n can be any suitable integer, with m being equal to or greater than 2. In an embodiment, m=4 and n=3. In another example, m=4 and n=2. In still another example, m=4 and n=1.

Figure 10:
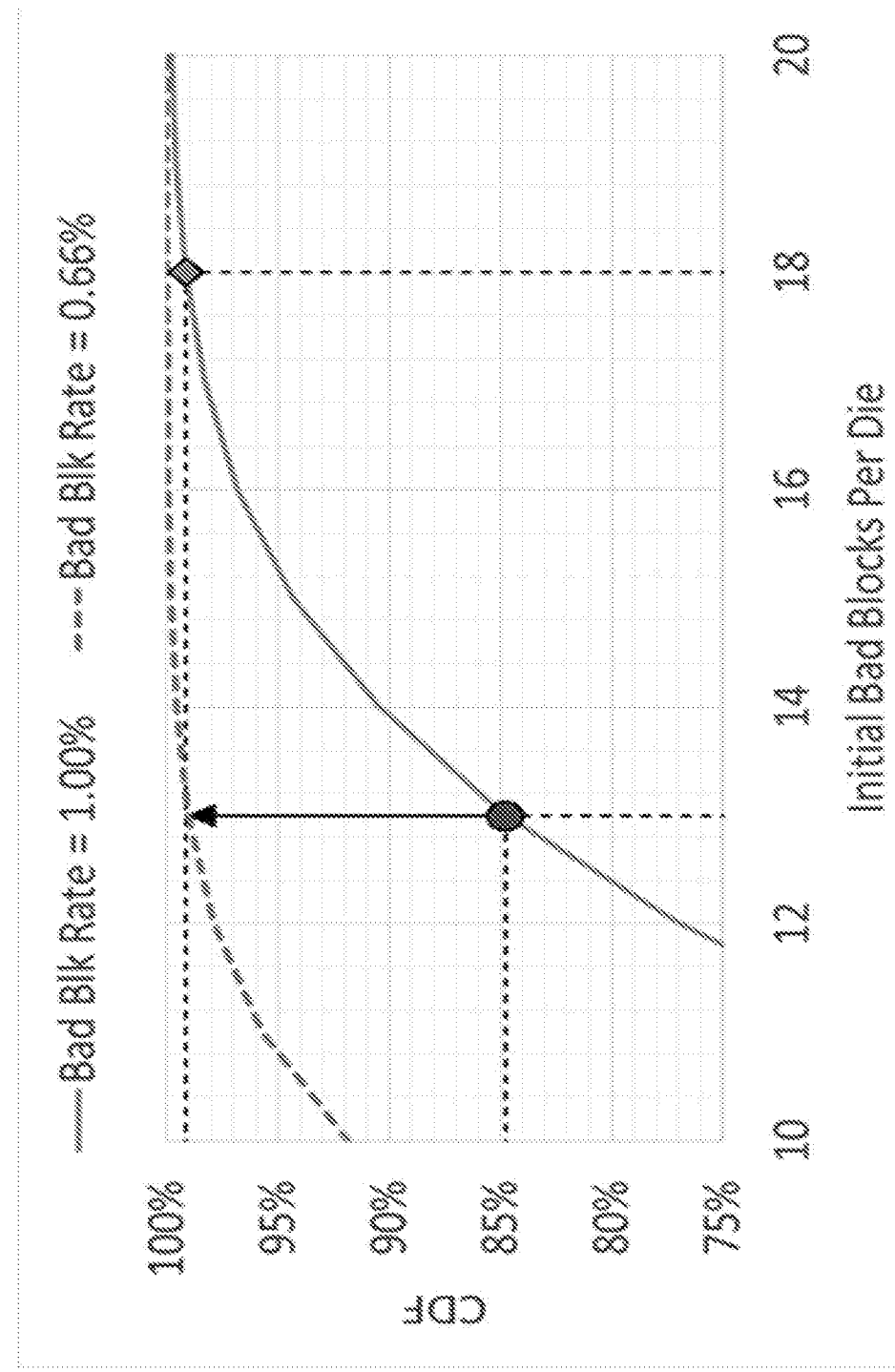
FIG. 10 illustrates the improvement of percentage of available blocks available during the screening of the device according to some embodiments of the present invention.

FIG. 10 illustrates the improvement of percentage of available blocks available during the screening of the device according to some embodiments of the present invention. The bad blocks identified during screening can also be used as write-cache. This increases the yield for a given rate of occurrence of initial bad blocks over a scheme where the location of SLC blocks in a NAND device is fixed. As shown in FIG. 10, the distribution of the number of initial bad blocks per die for bad-block rate of 1% and 1024 blocks per die. The yield is 85%, when acceptable initial bad blocks is 13 and 5 blocks are used in SLC mode. With dynamic mapping of bad blocks to SLC mode, the yield increases to 99%. Without the dynamic mapping as described above, achieving the same yield requires the bad-block rate to drop below 0.66%.

Figure 11:
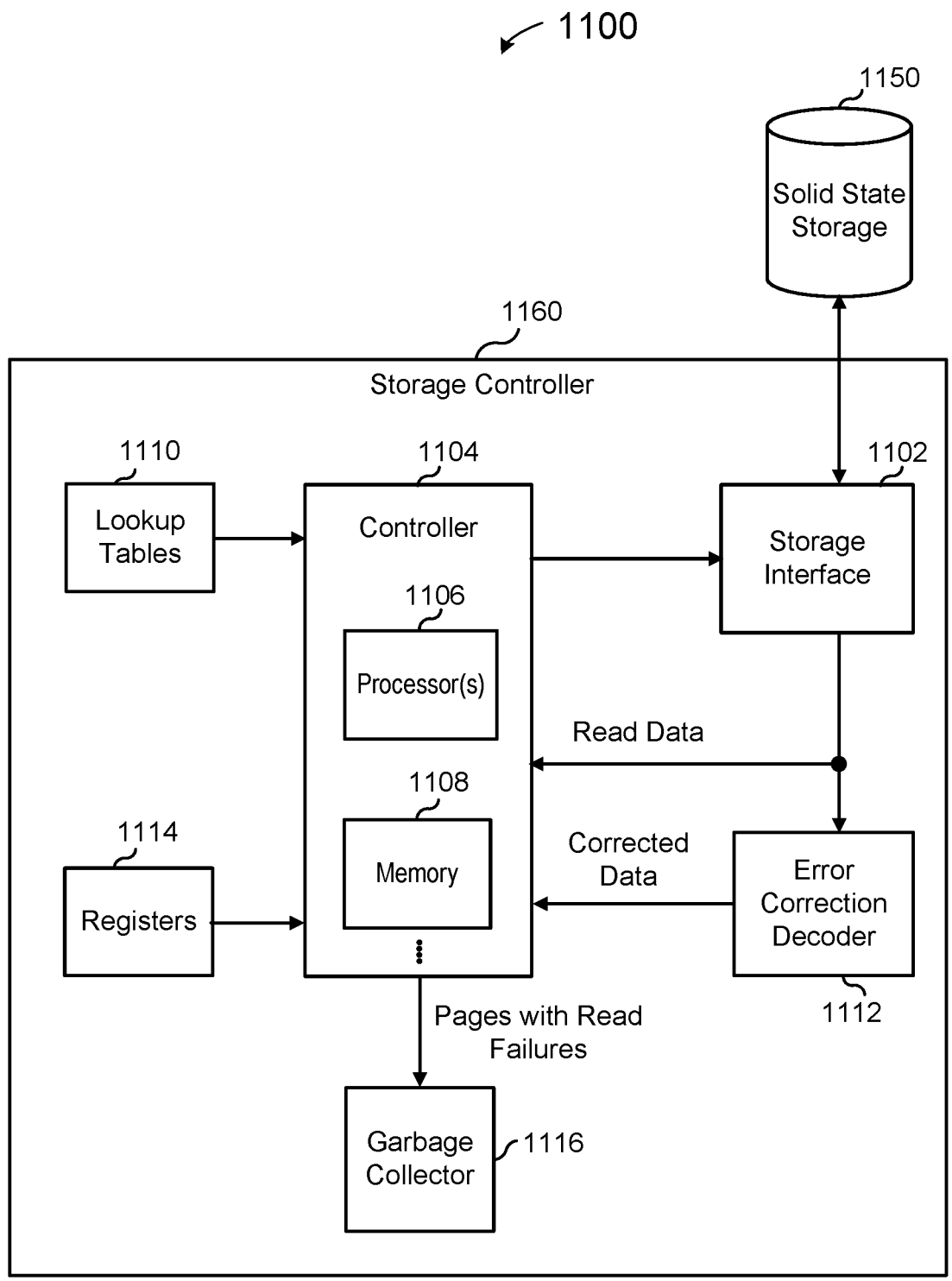
FIG. 11 is a simplified block diagram illustrating a solid state storage system in accordance with certain embodiments of the present disclosure.

FIG. 11 is a simplified block diagram illustrating a solid state storage system in accordance with certain embodiments of the present disclosure. As shown, solid state storage system 1100 can include a solid state storage device 1150 and a storage controller 1160. For example, solid state storage device 1150 can include a memory device 100 as depicted in FIG. 1. Storage controller 1160, also referred to as a memory controller, is one example of a system which performs the techniques described herein. In some embodiments, storage controller 1160 can be implemented on a semiconductor device, such as an ASIC or FPGA. Some of the functions can also be implemented in firmware.

Controller 1104 can include one or more processors 1106 and memories 1108 for performing the control functions described above. Storage controller 1160 can also include lookup tables 1110, which can include a table for degraded blocks and a table for bad blocks, etc. Registers 1114 can be used to store data for control functions, such as threshold values for degraded block counts, etc.

Controller 1104 can be coupled to solid state storage 1150 through a storage interface 1102. Error correction decoder 1112 (e.g., an LDPC decoder or a BCH decoder) can perform error correction decoding on the read data and send the corrected data to controller 1104. Controller 1104 can identify the pages with read failures to garbage collector 1116, which performs corrective processing on those pages (e.g., by copying the data, with or without error correction decoding, to a new location).

Figure 12:
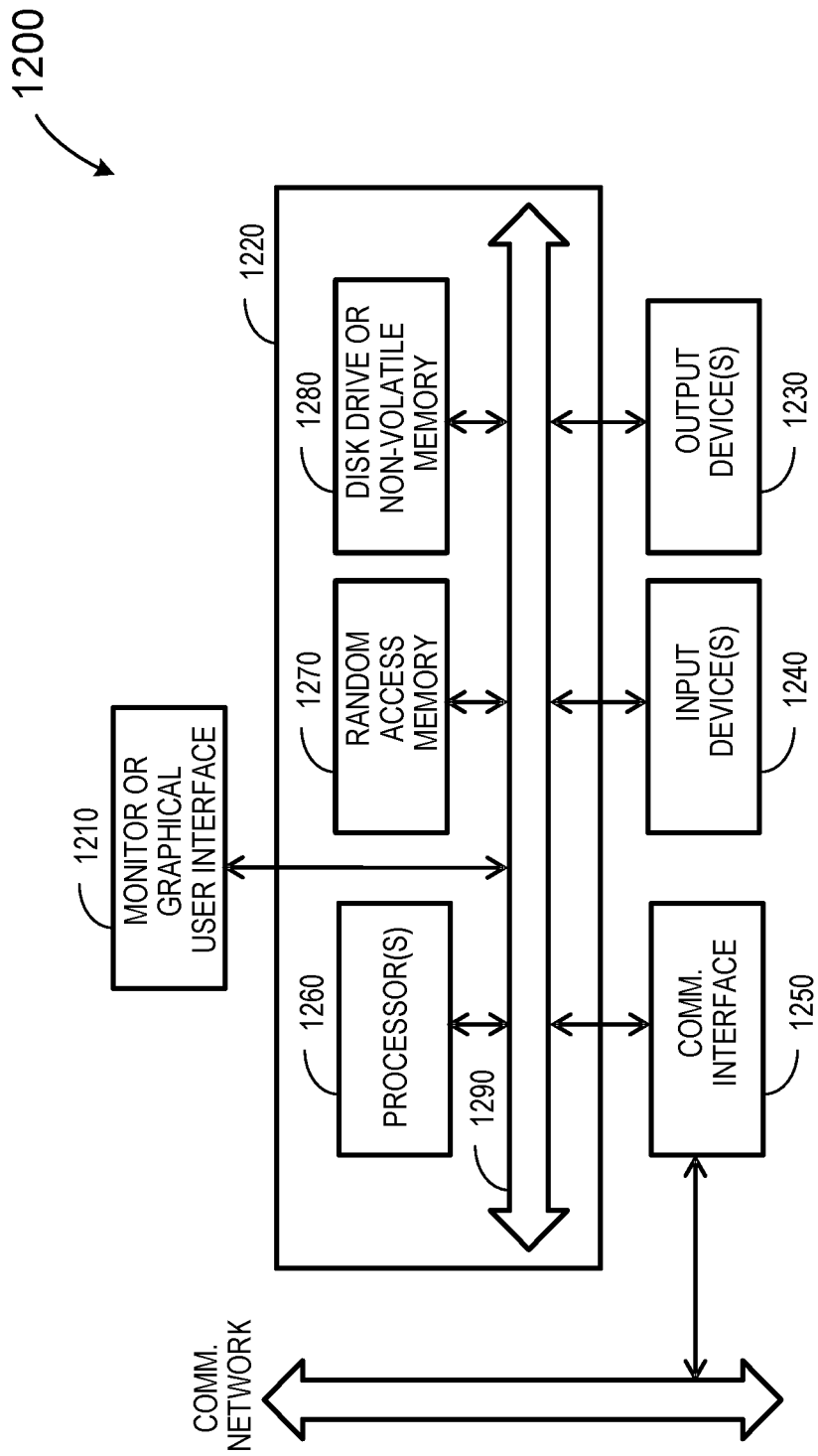
FIG. 12 is a simplified block diagram illustrating an apparatus that may be used to implement various embodiments according the present disclosure.

FIG. 12 is a simplified block diagram illustrating an apparatus that may be used to implement various embodiments according the present disclosure. FIG. 12 is merely illustrative of an embodiment incorporating the present disclosure and does not limit the scope of the invention as recited in the claims. One of ordinary skill in the art would recognize other variations, modifications, and alternatives. In one embodiment, computer system 1200 typically includes a monitor 1210, a computer 1220, user output devices 1230, user input devices 1240, communications interface 1250, and the like.

As shown in FIG. 12, computer 1220 may include a processor(s) 1260 that communicates with a number of peripheral devices via a bus subsystem 1290. These peripheral devices may include user output devices 1230, user input devices 1240, communications interface 1250, and a storage subsystem, such as random access memory (RAM) 1270 and disk drive 1280. As an example, a disk drive can include solid state disk (SSD) implemented with non-volatile memory devices such as memory device 100 depicted in FIG. 1 with features described above.

User input devices 1240 include all possible types of devices and mechanisms for inputting information to computer system 1220. These may include a keyboard, a keypad, a touch screen incorporated into the display, audio input devices such as voice recognition systems, microphones, and other types of input devices. In various embodiments, user input devices 1240 are typically embodied as a computer mouse, a trackball, a track pad, a joystick, wireless remote, drawing tablet, voice command system, eye tracking system, and the like. User input devices 1240 typically allow a user to select objects, icons, text and the like that appear on the monitor 1210 via a command such as a click of a button or the like.

User output devices 1230 include all possible types of devices and mechanisms for outputting information from computer 1220. These may include a display (e.g., monitor 1210), non-visual displays such as audio output devices, etc.

Communications interface 1250 provides an interface to other communication networks and devices. Communications interface 1250 may serve as an interface for receiving data from and transmitting data to other systems. Embodiments of communications interface 1250 typically include an Ethernet card, a modem (telephone, satellite, cable, ISDN), (asynchronous) digital subscriber line (DSL) unit, FireWire interface, USB interface, and the like. For example, communications interface 1250 may be coupled to a computer network, to a FireWire bus, or the like. In other embodiments, communications interfaces 1250 may be physically integrated on the motherboard of computer 1220, and may be a software program, such as soft DSL, or the like.

In various embodiments, computer system 1200 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1220 includes one or more Xeon microprocessors from Intel as processor(s) 1260. Further, one embodiment, computer 1220 includes a UNIX-based operating system.

RAM 1270 and disk drive 1280 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1270 and disk drive 1280 may be configured to store the basic programming and data constructs that provide the functionality of the present invention.

Software code modules and instructions that provide the functionality of the present invention may be stored in RAM 1270 and disk drive 1280. These software modules may be executed by processor(s) 1260. RAM 1270 and disk drive 1280 may also provide a repository for storing data used in accordance with the present invention.

RAM 1270 and disk drive 1280 may include a number of memories including a main random access memory (RAM) for storage of instructions and data during program execution and a read only memory (ROM) in which fixed non-transitory instructions are stored. RAM 1270 and disk drive 1280 may include a file storage subsystem providing persistent (non-volatile) storage for program and data files. RAM 1270 and disk drive 1280 may also include removable storage systems, such as removable flash memory.

Bus subsystem 1290 provides a mechanism for letting the various components and subsystems of computer 1220 communicate with each other as intended. Although bus subsystem 1290 is shown schematically as a single bus, alternative embodiments of the bus subsystem may utilize multiple busses. Bus system 1290 may be a PCI Express bus that may be implemented using PCIe PHY embodiments of the present disclosure.

FIG. 12 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A non-volatile data storage device, comprising:
   memory cells arranged in a plurality of blocks, each block including multiple pages and each of the multiple pages having a number of memory cells, wherein the plurality of blocks includes:
   multi-level user blocks, wherein each memory cell is an m-bit multi-level cell (MLC), m being an integer greater than or equal to 2;
   single-level user blocks, wherein each memory cell is a single-bit single-level cell (SLC); and
   single-level write-buffer blocks for improving write operation latency, wherein each memory cell is a one-bit single-level cell (SLC); and
   a memory controller coupled to the memory cells for controlling erase, program, and read operations of the memory cells, wherein the memory controller is configured to:
   perform a multi-level test operation to determine if a given block is a bad multi-level block;
   upon determining that the given block is a bad multi-level block, perform a single-level test operation to determine if the given block is a good single-level block;

upon determining that the given block is a good single-level block, determine whether the total number of single-level write-buffer blocks exceeds a threshold value;

upon determining that the total number of single-level write-buffer blocks exceeds a threshold value, assign the given block to be a single-level user block; and upon determining that the total number of single-level write-buffer blocks does not exceed a threshold value, increase a write-cache size using the bad multi-level block by assigning the given block determined as the bad multi-level block to be a single-level write-buffer block that caches write data.

2. The device of claim 1, wherein a given block is identified as a bad m-bit block if a count of bad pages in the block in an m-bit multi-level read test is above or equal to a threshold number; and wherein the given block is identified as a good m-bit block if the count of bad pages in the block is below the threshold number.

3. The device of claim 1, wherein a given block is identified as a bad single-bit block if a count of bad pages in the block in a single-bit multi-level read test is above or equal to a threshold number; and wherein the given block is identified as a good single-bit block if the count of bad pages in the block is below the threshold number.

4. The device of claim 1, wherein m=3, and the m-bit multi-level cell (MLC) is a tri-level cell (TLC).

5. A non-volatile data storage device, comprising:
memory cells arranged in a plurality of blocks; and
a memory controller coupled to the memory cells for controlling operations of the memory cells, wherein the memory controller is configured to:
  determine if a given block is a bad m-bit multi-level block, wherein each memory cell is an m-bit multi-level cell (MLC), m being an integer equal to or greater than 2;
  upon determining that the given block is a good m-bit multi-level block, assign the given block to be an m-bit multi-level user block;
  upon determining that the given block is a bad m-bit multi-level block, determine if the given block is a good n-bit block, wherein each memory cell is an n-bit cell, n being an integer less than m; and
  upon determining that the given block is a good n-bit block, select between assigning the given block to be an n-bit user block and increasing a write-cache size using the bad m-bit multi-level block by assigning the given block determined as the bad m-bit multi-level block to be an n-bit write-buffer block that caches write data.

6. The device of claim 5, wherein m=3 and n=1, wherein each memory cell in an m-bit multi-level block is a 3-bit tri-level cell (TLC), and wherein each memory cell in an n-bit multi-level block is a single-bit single-level cell (SLC).

7. The device of claim 5, wherein m=3 and n=2, wherein each memory cell in an m-bit multi-level block is a 3-bit tri-level cell (TLC), and wherein each memory cell in an n-bit multi-level block is a two-bit multi-level cell (MLC).

8. The device of claim 5, wherein m=4 and n=1, wherein each memory cell in an m-bit multi-level block is a 4-bit quad-level cell (QLC), and wherein each memory cell in an n-bit multi-level block is a single-bit single-level cell (SLC).

9. The device of claim 5, wherein m=4 and n=2, wherein each memory cell in an m-bit multi-level block is a 4-bit quad-level cell (QLC), and wherein each memory cell in an n-bit multi-level block is a two-bit multi-level cell (MLC).

10. The device of claim 5, wherein m=4 and n=3, wherein each memory cell in an m-bit multi-level block is a 4-bit quad-level cell (QLC), and wherein each memory cell in an n-bit multi-level block is a three-bit tri-level cell (TLC).

11. The device of claim 5, wherein each of the plurality of blocks includes multiple pages and each of the multiple pages includes a number of memory cells;

wherein a given block is identified as a bad m-bit multi-level block if a count of bad pages in the block in an m-bit multi-level read test is above or equal to a threshold number; and wherein the given block is identified as a good m-bit multi-level block if the count of bad pages in the block is below the threshold number.

12. The device of claim 5, wherein a given block is identified as a bad n-bit block if a count of bad pages in the block in an n-bit multi-level read test is above or equal to a threshold number; and wherein the given block is identified as a good n-bit block if the count of bad pages in the block is below the threshold number.

13. The device of claim 5, wherein the memory controller is configured to select between assigning the given block to be a single-level write-buffer block and assigning the given block to be a single-level user block, depending upon whether the total number of single-level write-buffer blocks exceeds a threshold value.

14. A method of controlling a storage system, the storage system comprising memory cells arranged in a plurality of blocks and a memory controller coupled to the memory cells for controlling operations of the memory cells, the method comprising:

determining if a given block is a bad m-bit multi-level block, wherein each memory cell is an m-bit multi-level cell (MLC), m being an integer equal to or greater than 2;

upon determining that the given block is a good m-bit multi-level block, assigning the given block to be an m-bit multi-level user block;

upon determining that the given block is a bad m-bit multi-level block, determining if the given block is a good n-bit block, wherein each memory cell is an n-bit cell, n being an integer less than m; and upon determining that the given block is a good n-bit block, selecting between assigning the given block to be an n-bit user block and increasing a write-cache size using the bad m-bit multi-level block by assigning the given block determined as the bad m-bit multi-level block to be an n-bit write-buffer block that caches write data.

15. The method of claim 14, wherein m=3 and n=1, wherein each memory cell in an m-bit multi-level block is a 3-bit tri-level cell (TLC), and wherein each memory cell in an n-bit multi-level block is a single-bit single-level cell (SLC).

16. The method of claim 14, wherein m=3 and n=2, wherein each memory cell in an m-bit multi-level block is a 3-bit tri-level cell (TLC), and wherein each memory cell in an n-bit multi-level block is a two-bit multi-level cell (MLC).

17. The method of claim 14, wherein m=4 and n=1, wherein each memory cell in an m-bit multi-level block is a 4-bit quad-level cell (QLC), and wherein each memory cell in an n-bit multi-level block is a single-bit single-level cell (SLC).

18. The method of claim 14, wherein each of the plurality of blocks includes multiple pages and each of the multiple pages includes a number of memory cells;

wherein a given block is identified as a bad m-bit multi-level block if a count of bad pages in the block in an m-bit multi-level read test is above or equal to a threshold number; and wherein the given block is identified as a good m-bit multi-level block if the count of bad pages in the block is below the threshold number.

19. The method of claim 14, wherein a given block is identified as a bad n-bit block if a count of bad pages in the block in an n-bit multi-level read test is above or equal to a threshold number; and wherein the given block is identified as a good n-bit block if the count of bad pages in the block is below the threshold number.

20. The method of claim 14, wherein selecting between assigning the given block to be a single-level write-buffer block and assigning the given block to be a single-level user block depends upon whether the total number of single-level write-buffer blocks exceeds a threshold value.

\* \* \* \* \*